(12) United States Patent
Griebeler

(10) Patent No.: US 9,953,815 B2
(45) Date of Patent: Apr. 24, 2018

(54) FAST-SWITCHING HIGH VOLTAGE WAVEFORM GENERATOR

(71) Applicant: Elmer Griebeler, Chesterfield, OH (US)

(72) Inventor: Elmer Griebeler, Chesterfield, OH (US)

(*) Notice: Subject to any disclaimer, the term of this patent is extended or adjusted under 35 U.S.C. 154(b) by 0 days.

(21) Appl. No.: 15/621,259

(22) Filed: Jun. 13, 2017

(65) Prior Publication Data

US 2017/0358435 A1 Dec. 14, 2017

Related U.S. Application Data

(60) Provisional application No. 62/349,376, filed on Jun. 13, 2016.

(51) Int. Cl.
| | | |
|---|---|---|
| *H03K 3/00* | (2006.01) | |
| *H01J 49/02* | (2006.01) | |
| *H03K 3/57* | (2006.01) | |
| *H03K 3/02* | (2006.01) | |
| *H01F 27/34* | (2006.01) | |
| *H02M 7/539* | (2006.01) | |

(52) U.S. Cl.
CPC ............ *H01J 49/022* (2013.01); *H01F 27/34* (2013.01); *H02M 7/539* (2013.01); *H03K 3/02* (2013.01); *H03K 3/57* (2013.01)

(58) Field of Classification Search
CPC ........... H03K 3/02; H03K 3/57; H02M 7/539; H01F 27/34; H01J 49/022

USPC .................................................. 327/304, 300
See application file for complete search history.

(56) References Cited

U.S. PATENT DOCUMENTS

| | | | | |
|---|---|---|---|---|
| 5,072,191 A  * | 12/1991 | Nakajima | ................ | H03K 3/53 327/300 |
| 7,417,522 B2 * | 8/2008 | Sung | ....................... | H01F 38/16 336/180 |
| 2009/0224813 A1* | 9/2009 | Kuthi | ..................... | C12M 35/02 327/304 |
| 2014/0268931 A1* | 9/2014 | Vogel | .................... | H02M 7/539 363/40 |
| 2015/0130525 A1* | 5/2015 | Miller | .................... | H03K 17/56 327/304 |
| 2015/0318846 A1* | 11/2015 | Prager | .................. | H03K 17/005 327/304 |

* cited by examiner

*Primary Examiner* — Thomas Skibinski
(74) *Attorney, Agent, or Firm* — George W. Moxon, II; . Brian P. Harrod

(57) ABSTRACT

A high-voltage waveform generator comprising a power source, a transformer unit comprising a magnetic core, attached to the power source, a plurality of power switch cards, each having an aperture that allows said magnetic core to pass therethrough, one or more control switches located on each power card, and a control means for actuating the control switches, a power output; wherein the power switch cards are connected in series, wherein each of the apertures in the power switch cards is surrounded by conductive windings, whereby when the power source is activated, the magnetic core induces a current in each of the conductive windings, and wherein the control means activates the control switches simultaneously in under 100 nanoseconds to generate a pulse.

5 Claims, 3 Drawing Sheets

FAST-SWITCHING HIGH VOLTAGE WAVEFORM GENERATOR

CROSS REFERENCE TO OTHER APPLICATIONS

This application claims the benefit of U.S. Provisional Application No. 62/349,376, filed Jun. 13, 2016.

BACKGROUND OF THE INVENTION

The present invention is directed to a waveform generator that can rapidly switch high voltage, direct current on and off in nanosecond speeds to create a pulse or an alternating current.

Rapid switching pulse generators are known. For example, US Patent publication 2015/0318846 by Prager et al. teaches a nanosecond pulser that includes one or more switch circuits including one or more solid state switches, a transformer, and an output electrically coupled with the secondary winding and may output electrical pulses having a peak voltage greater than about 1 kilovolt and a rise time of less than 150 nanoseconds or less than 50 nanoseconds.

Electricity is transmitted from generators to users as high voltage alternating current. High voltage is used to minimize resistive heat loss in the transmission lines. Alternating current is used because it is the most economical form of generation and transmission on large scales, such as power generation for large cities. Use of direct current on such a scale has proven difficult.

One method for converting direct current (DC) to alternating current (AC) comprises using a DC power source connected to switches, whereby the switches are actuated rapidly to alternate the direction of the flow of current, thus creating alternating current.

Current attempts to rapidly cycle switches on and off have been plagued by stray capacitance, also known as parasitic capacitance, the unintended and unwanted capacitance in a circuit. Presently, a device capable of generating high voltage direct current can be built, but when such a device is used to convert DC to AC, the stray capacitance creates long delays, making a practical DC to AC conversion impossible. It only gets worse with scale: as the voltage increases, so does the delay, exacerbating the problem.

One of the oldest methods of creating high voltage in the prior art uses a step up transformer with an inductive flyback circuit. Stray capacitance and inductance within the transformer severely limits the rise and fall rates. This method cannot supply various pulse shapes. The inductive flyback method quickly drops back to zero volts because the transformer cannot sustain such a high voltage. With plasma thrusters it is beneficial if the pulse can fall slowly to avoid negative ionization, rise quickly to produce copious positive ionization, and then a high voltage to accelerate the ions. Other applications need other waveforms. Other methods of high voltage DC power supplies are well known. High voltage pulse generators that use step up transformers and spark gaps are well known.

Another method uses coaxial cables charged to high voltages. This is intended for voltage rise and fall speeds of about one nanosecond and produces square pulses with pulse widths of up to a few nanoseconds. This method cannot supply bias-plus-pulse or other wave shapes.

High voltage transformers have been proposed to address stray capacitance. For example, U.S. Pat. No. 7,417,522 to Sung et al. teaches a high voltage transformer that can be fabricated in a small size and in a cost-effective manner, and designed to minimize stray capacitance generated between components.

Power boosters have been proposed that focus on DC power. For example, US Patent Publication 2014/0268931 by Vogel taches a DC-to-DC boost converter for converting power received from a variable, low voltage DC source, comprising a plurality of interleaved, isolated, full-bridge DC-DC converters arranged in a Delta-Wye configuration and a multi-leg bridge.

SUMMARY OF THE INVENTION

A high-voltage waveform generator comprising a power source, a transformer unit comprising a magnetic core, attached to the power source, a plurality of power switch cards, each having an aperture that allows said magnetic core to pass therethrough, one or more control switches located on each power card, and a control means for actuating the control switches, a power output; wherein the power switch cards are connected in series, wherein each of the apertures in the power switch cards is surrounded by conductive windings, whereby when the power source is activated, the magnetic core induces a current in each of the conductive windings, and wherein the control means activates the control switches simultaneously in under 100 nanoseconds to generate a pulse.

BRIEF DESCRIPTION OF THE DRAWINGS

The foregoing and other features and advantages of the present invention will become apparent to those skilled in the art to which the present invention relates upon reading the following description with reference to the accompanying drawings, in which.

DETAILED DESCRIPTION OF THE INVENTION

The present invention is directed to an improved high voltage, direct current, pulse generator. This invention relates generally to high voltage waveform generators, and more particularly, to a method to create high voltage waveforms that contain transitions at nanosecond speeds.

The present invention comprises an apparatus for generating high voltage current that can be rapidly switched on and off, where the switching is measured on the scale of the nanosecond range. This allows for the transmission and conversion of high voltage direct current. As used herein, "high voltage" means the voltage is in the kilovolt range; that is, around 1,000 volts or more.

Figure 1:
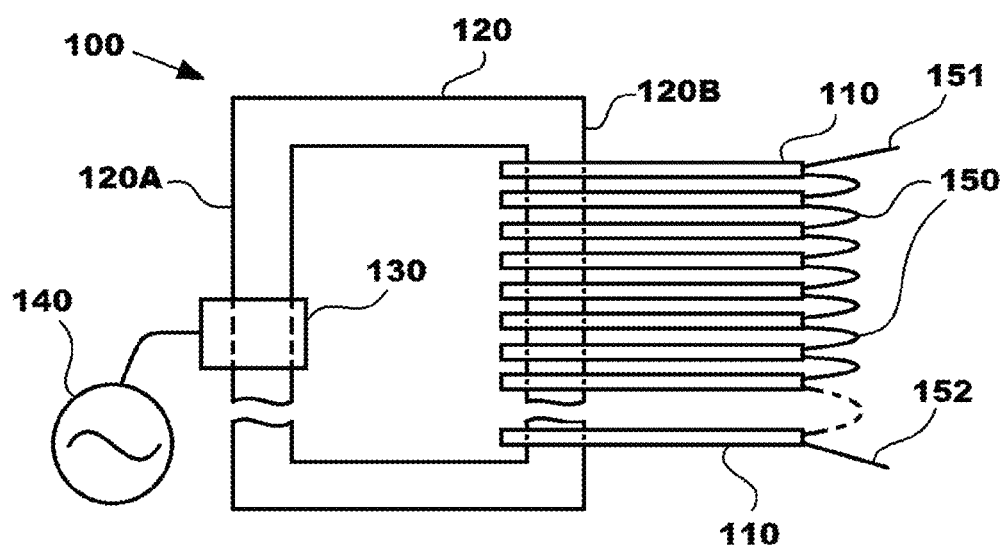
FIG. 1 is a partial cross sectional view of schematic of a high voltage waveform generator.
Figure 3:
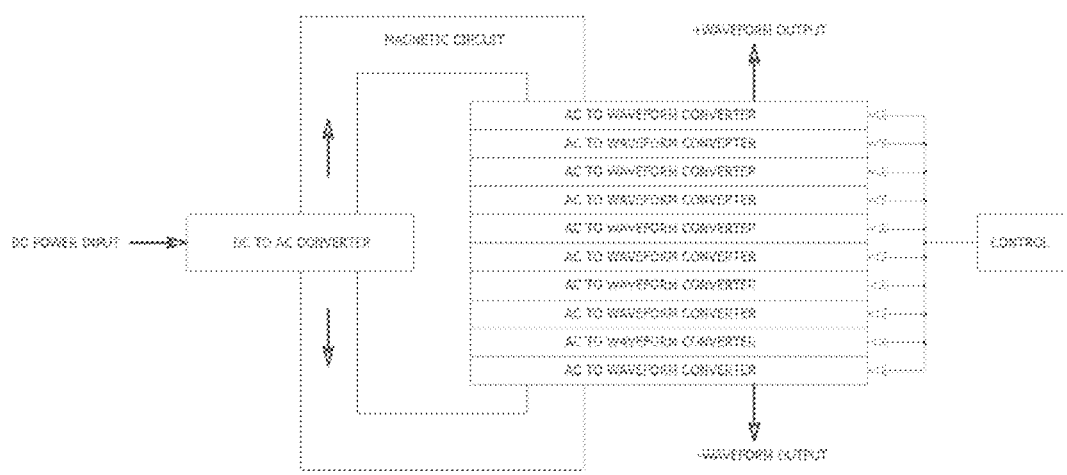
FIG. 3 is a side view of the waveform generator shown in FIG. 1 showing the switch controls.

In general, as shown in FIG. 1, the high voltage pulse generator 100 consists of a transformer unit that employs a parallel stack of power switch cards 110 having series output connections 150. While the outputs of cards are connected in series 150, the cards are otherwise electrically isolated from each other. Power is provided inductively to the cards by a magnetic core 120 that passes through each of the cards perpendicularly and completes a magnetic circuit away from the cards. A separate power supply 140 provides the power for the magnetic field in the magnetic core. The power supply 140 can be alternating current (AC), or it can be direct current (DC) that is converted to AC. The power switch cards 110 all receive the same waveform commands via a set of fiber optic cables from a separate control card so that they switch on and off together. See FIG. 3.

The magnetic core 120 is configured in the shape of a rectangular annulus or loop of magnetically conductive material and forms a magnetic circuit. As shown in FIG. 1, the core has a top, a bottom, and two sides: a power input side 120A, and a power switch card side 120B. On the power input side 120A, conductive windings 130 are attached to a power source 140, which, when activated, induces a magnetic field in the core 120. The core passes 120 through each of the power cards 110 to induce the same voltage in each of the power switch cards. This comes about because transformers transfer an input/primary AC voltage to the output/secondary voltage based strictly by the ratio of the primary to secondary turns. Each of the power switch cards has an identical number of secondary turns.

The output of a card is connected in series to the next card in the stack. I.e. card n sends its current to card n+1 and receives the output current from card n−1. Due to the magnetic core 120 passing through each card 110 and inducing the same current, each card has the same voltage, and voltage changes are simultaneous and identical throughout the stack of cards.

Figure 2:
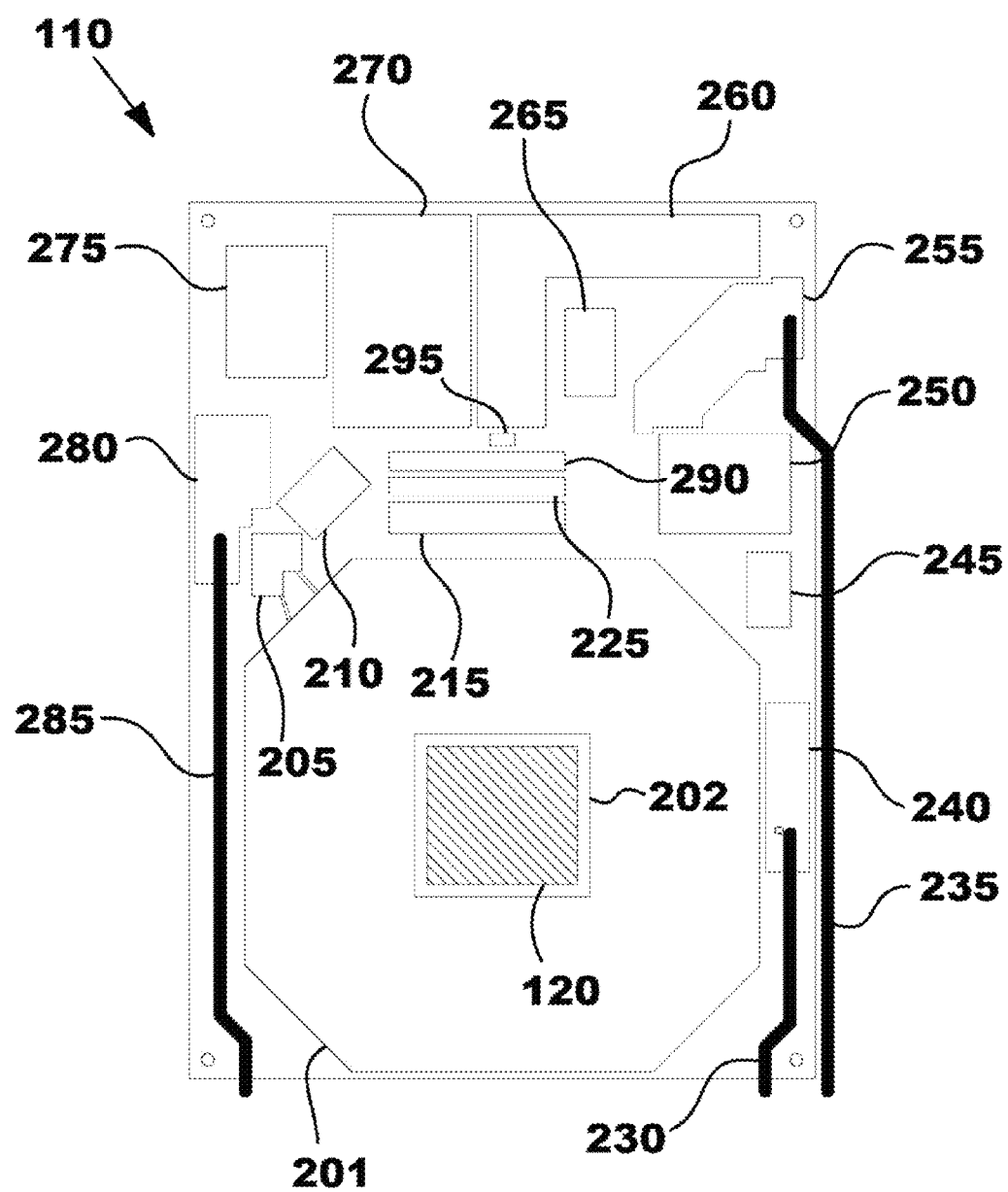
FIG. 2 is a top plan view of a power card shown in FIG. 1.

The power switch card 110 is shown in FIG. 2, and is an electronic circuit board. The power card 110 has an aperture 202 that allows the magnetic core 120 to pass perpendicularly through the card. The aperture 202 is located inwardly from the edges or perimeter of the power card; that is, the aperture is positioned within the interior or "body" of the card. The aperture 202 is surrounded by conductive windings 201, which are equivalent to secondary windings in a transformer, and in which a current is induced when the magnetic core 120 is energized. This induced alternating current is converted to direct current by rectifier 215 and stored in capacitor 225. Over voltage protection 290 prevents any voltage that could damage the electronic components. The card further features down control power 205 and up control 245. Down control 205 powers the control for the pull down transistor switch 275. Up control 245 powers the pull up transistor switch 250. The card further features reverse protection 210 for the pull down transistor switch 275, and reverse protection 265 for the pull up transistor switch 250.

Additional features include voltage sensing 240 for voltage control, voltage feedback optical cable 230, pull up command optical cable 235. As used herein, "pull up command" is a signal in the form of light intensity coming from the pulse generator card that commands the pull up transistor to turn on. Pull up transistor switch 250 is a high power transistor switch controlled by circuit 255 which in turn is commanded by the optical signal on the optical cable 235. Optical switch control 255 receives its command from cable 235, is powered by the small power source 245, and turns the transistor 250 on and off. Pull up output inductor 260 slows down the voltage rise rate of the output of the card to the desired rate, typically 300 nanoseconds. Pull down output inductor 270 slows down the voltage fall rate of the output of the card to the desired rate, typically 1500 nanoseconds. Pull down transistor switch 275 is the power transistor switch that pulls the output of the card down to zero volts. Optical switch control 280, optical fiber cable 285 transmits switching signals, over-voltage protection 290, and spring contact 295 to the next board. The previous card contacts this card from underneath. The voltage and current from this card is connected between this contact point underneath and the spring contact 295 on top. The protection and feedback devices 290, 210, 265, 240, 230 are for practical operation. All the rest are part of the critical operation.

[Control Switches/Waveform Generation]

Each of the power switch cards features one or more control switches. Each card has a transistor switch to connect the output (the upper spring contact) to the voltage stored in storage capacitor 225 and another transistor switch which shorts the output to the contact on the backside of the card at the contact to the next card 295. These switches are used to generate a large variety of waveforms/pulse shapes. The maximum voltage is determined by the number of cards used. Typical examples of the variety of pulse shapes that can be generated with this arrangement include narrow pulse, narrow pulse width bias (a high voltage steady state voltage), triangular, square wave, and pulse width modulation which can simulate any arbitrary waveform.

The optical cables 285 and 235 are connected to control means 280 and 255, respectively, which send signals to the transistor switches 275 and 250, respectively. The corresponding switches on each card receive their instructions simultaneously, so as to switch in unison to create the desired pulse shape. Each of the control switches is a solid state components, and can be a MOSFET (metal-oxide-semiconductor field-effect transistor) or an IGBT (insulated-gate bipolar transistor), with a MOSFET preferred since an IGBT would be work, but would be significantly slower. The exact mechanism for conveying the switch commands to the switches is not critical, but one way that has proven effective is the use of fiber optic lines.

Great care is taken to make sure that the two switches on each card are never on at the same time since this would short out the power on the card. If the switches were left open, the card output, and therefore the stack output, would be undefined and would drift around or be easily loaded down to zero. There are protection circuits built in for such eventualities.

The waveform generator has several built-in safety mechanisms and allows for robust design and construction, including protecting against overvoltage and short circuits. The voltage is naturally equally distributed between the cards since the voltage for each card comes from the same power input magnetic core. One such protection mechanism is a pair of reverse protection diodes 210, 265, which protect in case the switches activate out of sync. Output reverse polarity diodes are used to accommodate the inevitable mismatch in the switching speeds of the cards. This diode allows the current to flow in a reverse direction, protecting the electronics from reverse voltage resulting from unsynchronized switching. The switches in the cards have current sense circuits to prevent overcurrent, for example, in the case of an output short circuit. Another protection mechanism is a transient voltage suppressor (TVS) 290, which protects against over-voltage. TVS 290 is a Zener diode, but of a high peak power design which conducts current in the backwards direction if the voltage attempts to exceed the TVS's design voltage.

The consequence of this stacked arrangement is that the voltage generated is the sum of the individual power switch cards 110. The rise and fall rate of the voltage generated by the stack is the rise and fall rate of the individual power switch card 110 divided by the number of stacked cards. For example, a stack of ten cards will have a rise and fall rate ten times higher than any one card. Another consequence of this stacked arrangement is that any voltage can be generated just by increasing the size of the stack. Theoretically, there is no limit to the voltage that can be generated; in reality, it is limited by equipment cost and space.

This stacked arrangement allows for the maximum voltage and pulse rise and fall rates to be increased simply by increasing the number of cards. The maximum voltage and rate of voltage rise and fall is multiplied by the number of cards. For example, use of 10 cards will increase the maximum voltage output available by 10 times the voltage of an individual card, and the maximum rate of rise and fall is also multiplied by 10.

Although the invention has been described in detail with reference to particular examples and embodiments, the examples and embodiments contained herein are merely illustrative and are not an exhaustive list. Variations and modifications of the present invention will readily occur to those skilled in the art. The present invention includes all such modifications and equivalents. The claims alone are intended to set forth the limits of the present invention.

What is claimed is:

1. A high-voltage waveform generator comprising:
    a power source,
    a transformer unit comprising
        a magnetic core, attached to said power source,
        a plurality of power switch cards, each having an aperture that allows said magnetic core to pass therethrough,
        one or more control switches located on each power card, and
        a control means for actuating said control switches,
    a power output;
    wherein said power switch cards are connected in series,
    wherein each of said apertures in said power switch cards is surrounded by conductive windings,
    whereby when said power source is activated, said magnetic core induces a current in each of said conductive windings, and
    wherein said control means activates said control switches simultaneously in under 100 nanoseconds to generate a pulse.

2. The apparatus of claim 1 wherein said magnetic core is a generally rectangular, magnetic circuit.

3. The apparatus of claim 1 wherein said aperture is located inwardly from the edges of each of said power cards.

4. The apparatus of claim 1 wherein said plurality of power cards are arranged parallel in a stack.

5. The apparatus of claim 1 wherein said one or more control switches located on each power card are transistor switches.

* * * * *